(12) United States Patent
Kawasaki

(10) Patent No.: US 7,754,286 B2
(45) Date of Patent: Jul. 13, 2010

(54) METHOD OF FORMING A SILICON DIOXIDE FILM

(75) Inventor: Masahiro Kawasaki, Fukui (JP)

(73) Assignee: KST World Corp., Fukui (JP)

( * ) Notice: Subject to any disclaimer, the term of this patent is extended or adjusted under 35 U.S.C. 154(b) by 0 days.

(21) Appl. No.: 11/878,717

(22) Filed: Jul. 26, 2007

(65) Prior Publication Data
US 2007/0266934 A1 Nov. 22, 2007

Related U.S. Application Data

(63) Continuation of application No. 10/470,060, filed on Jul. 24, 2003, now abandoned.

(30) Foreign Application Priority Data

Dec. 6, 2001 (JP) ............................. 2001-372474
Nov. 25, 2002 (JP) ....................... PCT/JP02/12272

(51) Int. Cl.
*B05D 3/00* (2006.01)
*B05D 3/04* (2006.01)
*C23C 16/00* (2006.01)
(52) U.S. Cl. ............. 427/377; 427/255.18; 427/255.37; 427/372.2; 427/419.2
(58) Field of Classification Search ................. 438/770, 438/795; 427/116
See application file for complete search history.

(56) References Cited

U.S. PATENT DOCUMENTS 3,158,505 A * 11/1964 Sandor ....................... 428/336
(Continued)

FOREIGN PATENT DOCUMENTS

JP 50-19363 2/1975
(Continued)

OTHER PUBLICATIONS

European Patent Office, Supplementary European Search Report citing two references in corresponding foreign Application. No. EP 02 80 4354.

(Continued)

*Primary Examiner*—David Turocy
(74) *Attorney, Agent, or Firm*—Smith, Gambrell & Russell, LLP

(57) ABSTRACT

There is provided a method of forming a silicon dioxide film, which comprises repeating a step of depositing a silicon layer on a silicon substrate to form a silicon dioxide film of a predetermined thickness, and which makes it possible to suitably select the surface roughness of the silicon dioxide film that is formed and the rate of growth of the silicon film that is deposited. According to the method of forming the silicon dioxide film that is proposed above, it comprises a step of depositing any one of polysilicon, epitaxial silicon or amorphous silicon on the silicon substrate or on the silicon dioxide film formed on the silicon substrate by the thermal oxidation treatment to form a silicon film, and a step of thermally oxidizing the silicon film to convert it into a silicon dioxide film, the step of deposition and the step of thermal oxidation being repeated a plural number of times.

2 Claims, 2 Drawing Sheets

U.S. PATENT DOCUMENTS

| | | | |
|---|---|---|---|
| 3,807,039 | A | 4/1974 | Jacobson et al. |
| 4,604,304 | A | 8/1986 | Faraone et al. |
| 4,698,316 | A | 10/1987 | Corboy et al. |
| 4,902,086 | A * | 2/1990 | Henry et al. ................ 385/130 |
| 4,921,833 | A | 5/1990 | Takano |
| 5,088,003 | A | 2/1992 | Sakai et al. |
| 5,521,126 | A | 5/1996 | Okamura et al. |
| 6,239,044 | B1 | 5/2001 | Kashiwagi et al. |
| 6,468,845 | B1 | 10/2002 | Nakajima et al. |
| 2001/0001384 | A1 | 5/2001 | Arai et al. |

FOREIGN PATENT DOCUMENTS

| | | | |
|---|---|---|---|
| JP | 60-66443 | | 4/1985 |
| JP | 61036936 A | * | 2/1986 |
| JP | 2-246226 | | 10/1990 |
| JP | 5-210022 | | 8/1993 |
| JP | 5-232683 | | 9/1993 |
| JP | 06275689 A | * | 9/1994 |
| JP | 11-214379 | | 8/2001 |
| JP | 2002-148462 | | 5/2002 |

OTHER PUBLICATIONS

Korean Patent Office Action of Aug. 25, 2005.

* cited by examiner (a) — 2 SILICON SUBSTRATE (b) — 4 SILICON DIOXIDE FILM / 2

(c) — 6 SILICON FILM / 4 / 2

(d) — 8 SILICON DIOXIDE FILM / 4 / 2

(e) — SILICON FILM / 8 / 4 / 2

(f) — SILICON DIOXIDE FILM / 8 / 4 / 2, with thickness T indicated

Fig. 2

| | Polysilicon | Epitaxial silicon | Amorphous silicon |
|---|---|---|---|
| Monosilane (SiH$^4$) | 100% | 20% | 100% |
| | 80 cc/min | 1,200 cc/min | 80 cc/min |
| Temperature | 570°C | 1,000°C | 520°C |
| Pressure | 100 Pa | 5,320 Pa | 100 Pa |
| Film growing rate | 0.0020 μm/min | 1.06 μm/min | 0.0013 μm/min |
| Surface roughness (RMS) | 20.5 nm | 0.15 nm | 0.4~0.7 nm |

METHOD OF FORMING A SILICON DIOXIDE FILM

CROSS REFERENCE TO RELATED APPLICATION

This application is a continuation of U.S. Ser. No. 10/470,060, filed Jul. 24, 2003, now abandoned and which is being incorporated in its entirety herein by reference.

TECHNICAL FIELD

The present invention relates to a method of forming a thick silicon dioxide film on a silicon substrate.

BACKGROUND ART

A material obtained by forming a thick silicon dioxide film on a silicon substrate has been used for the devices that are used in such fields as soft photonics which is chiefly concerned to optical data communication and processing technology, amenity photonics which aims at utilizing a light for the optical display and optical input/output which are easy for human beings and environment to use, and hard photonics challenging ultimateness of a new source of light and developing a technology for utilizing optical measurement.

An optical waveguide in an optical integrated device, for example, is formed by burying a core layer having an optical waveguide circuit pattern in a silicon dioxide film on a silicon substrate. In this case, the silicon dioxide film must have a thickness which is at least not smaller than ten and several microns if the thickness of the core layer is selected to be, for example, the almost same size as that of an optical fiber that is connected.

A typical method of forming the silicon dioxide film on the silicon substrate can be represented by a well-known direct thermal oxidation method. The direct thermal oxidation method is to form a silicon dioxide film by directly thermally oxidizing the surface of the silicon substrate. The thickness of the film that is formed varies in proportion to the time of oxidation when it has a small thickness. However, since the oxidation reaction is conducted through the oxide film that has been formed, formation of the film having a large thickness takes a time in proportion to the one-half power of the time of oxidation. It is therefore difficult to form a film having a thickness of as large as ten and several microns or more. In order to increase the rate of oxidation, therefore, there has been put into practical use a high-pressure oxidation method in an oxidizing atmosphere of ten and several atms to 25 atms. However, this method is accompanied by such barriers as legal restrictions related to high pressures and expensive facility costs. It is therefore virtually difficult to form a silicon dioxide layer having a thickness of as large as ten and several microns to 100 microns or more.

In order to solve the above problems, the present applicant has developed a method of forming a silicon dioxide film by the deposition of polysilicon (Japanese Patent Application No. 342893/2000 "Method of Forming a Silicon Dioxide Film and Method of Forming Optical Waveguide"). This method is to form a silicon dioxide layer of a desired thickness by depositing polysilicon on a silicon substrate, followed by thermal oxidation treatment to form a silicon dioxide film, then, newly depositing polysilicon on the thus formed silicon dioxide film, followed by thermal oxidation treatment to form a silicon dioxide film, and repeating the above operations.

DISCLOSURE OF THE INVENTION

Formation of the silicon dioxide film by the deposition of polysilicon, however, involves problems that must be improved as described below.

(1) Surface Roughness of the Silicon Dioxide Film:

The silicon dioxide film formed by the deposition of polysilicon has relatively rough surfaces. When, for example, a silicon dioxide film is deposited on these surfaces for forming an optical waveguide core layer, a rough surface exists on the boundary surface causing light to be scattered and inviting a possibility of increasing optical loss. As required, therefore, the surfaces of the silicon dioxide film are flattened prior to forming the core layer to improve the surface roughness.

(2) Productivity:

A thick film formed by the deposition of polysilicon is favorable for forming a silicon dioxide film on a large quantity of wafers. However, formation of the film having a thickness of, for example, ten and several microns requires a time of several days though this is still quicker than the method based on the direct thermal oxidation. When there is employed a reduced-pressure vapor-phase deposition method which is a typical silicon film deposition method, it becomes necessary to use a production facility working under a pressure reduced to a large degree. It has, therefore, been desired to provide a production system capable of suitably meeting a variety of customer's requirements for forming the silicon dioxide film, a requested delivery time and a quantity of production, and others.

The present invention has been accomplished in view of the above-mentioned fact, and its technical subject is to provide a method of forming a silicon dioxide film, which comprises repeating steps of depositing a silicon layer on a silicon substrate and then, subjecting the silicon layer to a thermal oxidation treatment to form a silicon dioxide film of a predetermined thickness, and which makes it possible to suitably select the surface roughness of the silicon dioxide film that is formed and the rate of growth of the silicon film that is deposited.

As a method of forming a silicon dioxide film to solve the above technical subject, according to the present invention, there is provided a method of forming a silicon dioxide film, comprising the steps of:

a deposition step of depositing any one of polysilicon, epitaxial silicon or amorphous silicon on a silicon substrate or on the silicon dioxide film formed on the silicon substrate by a thermal oxidation treatment; and a thermal oxidation step of oxidizing the silicon film by heat to convert it into a silicon dioxide film;

the step of deposition and the step of thermal oxidation being repeated a plural number of times.

The silicon film is deposited by selecting any one of polysilicon deposition, epitaxial silicon deposition or amorphous silicon deposition, or by selecting a combination thereof so that the surface roughness and the rate of growth of the silicon dioxide film that is formed can be suitably changed.

Desirably, the thickness of the silicon film formed per one time of the deposition step is not larger than 5 μm.

BRIEF DESCRIPTION OF THE DRAWINGS

FIG. 2 is a table showing one example of results of the experiment.

BEST MODE FOR CARRYING OUT THE INVENTION

A method of forming a silicon dioxide film according to the present invention will now be described in detail with reference to the case of forming a silicon dioxide film having a thickness of 15 μm as one example.

Figure 1:
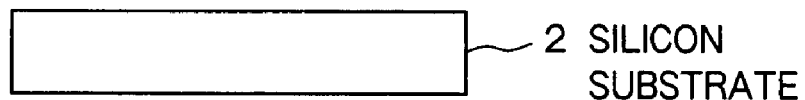
FIG. 1 is a diagram illustrating the steps of a method of forming a silicon dioxide film according to the present invention.
Figure 1:
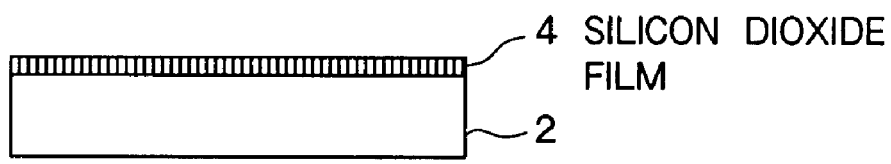
Figure 1:
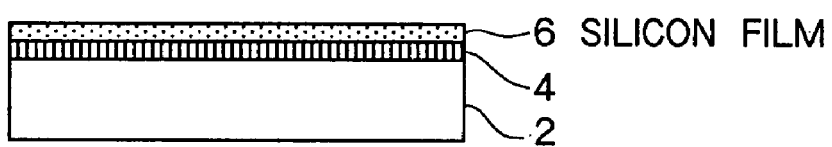
Figure 1:
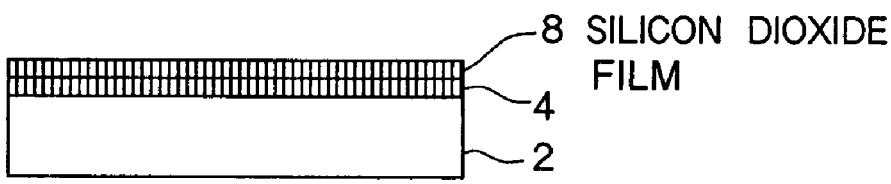
Figure 1:
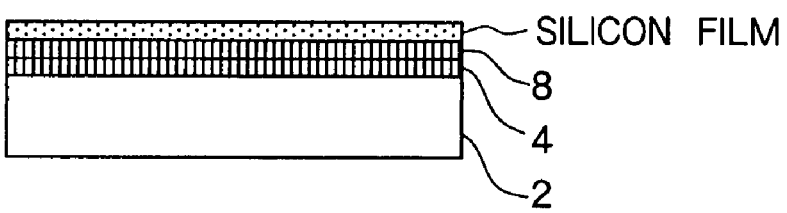
Figure 1:
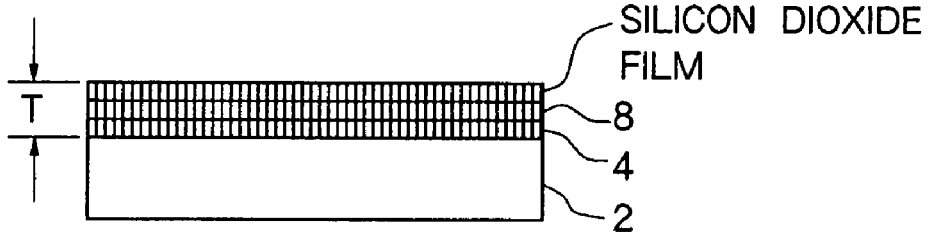

(1) Thermal Oxidation of Silicon Substrate:

A silicon substrate 2 shown in FIG. 1(a) is oxidized by heat in an electric furnace to form a silicon dioxide film 4 on a surface of the silicon substrate 2 as shown in FIG. 1(b). The thermal oxidation is conducted according to a wet oxidation method using, for example, water vapor. The wet oxidation can be carried out at a temperature of 1080° C. that is fully lower than a melting point which is 1410° C. of the silicon substrate 2, without requiring the treatment under a high pressure. In this step of thermal oxidation, there is formed the silicon dioxide film having a thickness of, for example, 2 μm.

(2) Step of Deposition:

As shown in FIG. 1(c), on the above silicon dioxide film 4 is deposited polysilicon, epitaxial silicon or amorphous silicon by a known chemical vapor-phase deposition method (CVD) to form a silicon film 6. As the chemical vapor-phase deposition method, there is used a typical reduced-pressure vapor-phase deposition method. The selection of polysilicon, epitaxial silicon or amorphous silicon and the reduced-pressure vapor-phase deposition method will be described later. In this step, there is formed a silicon-deposited film having a thickness of, for example, 1 μm. It is desired that the thickness of the film is not larger than 5 μm so that a large rate of oxidation can be obtained in the next step of thermal oxidation.

(3) Step of Thermal Oxidation:

Like the thermal oxidation of the silicon substrate in (1) above, the silicon film 6 is oxidized by heat in the electric furnace to form, as shown in FIG. 1(d), a silicon dioxide film 8 of the same quality on the first silicon dioxide film 4. The above silicon film 6 of the thickness of 1 μm turns into the silicon dioxide film 8 of a thickness of 3 μm due to the expansion of volume by the thermal oxidation.

(4) Repetition of the Step of Deposition and the Step of Thermal Oxidation:

As shown in FIGS. 1(e) and 1(f), the above step of deposition and the step of thermal oxidation are repeated until there is formed a silicon dioxide film having a predetermined thickness T of 15 μm. The film thickness T of 15 μm is obtained by repeating the step of deposition and the step of thermal oxidation five times, respectively. Namely, thermal oxidation of the substrate 2 μm+(3 μm×4 times)+(1 μm×1 time)=15 μm.

The final film of the thickness of 1 μm is formed by thermally oxidizing the silicon film having a thickness of 0.3 μm.

(5) Deposition of Silicon by the Reduced-Pressure Vapor-Phase Deposition Method:

The deposition of polysilicon, epitaxial silicon and amorphous silicon by the reduced-pressure vapor-phase deposition method will now be described with reference to FIG. 2 which shows one example of results of experiment conducted by the present inventor.

(5-1) Deposition of Polysilicon:

Deposition of polysilicon makes it possible to form a polycrystalline silicon film in a manner as described below.

Under the conditions of a monosilane gas ($SiH_4$) of 100%, 80 cc/min, 570° C. and 100 Pa (0.75 Torr), the film grew at a rate of 0.0020 μm/min and the surface roughness RMS after the thermal oxidation treatment was 20.5 nm.

(5-2) Deposition of Epitaxial Silicon:

Deposition of epitaxial silicon makes it possible to form a film of monocrystalline silicon by the silicon epitaxial growth in a manner as described below.

Under the conditions of a monosilane gas ($SiH_4$) of 20%, 1200 cc/min, 1000° C. and 5320 Pa (40 Torr), the film grew at a rate of 1.06 μm/min and the surface roughness RMS after the thermal oxidation treatment was 0.15 nm.

(5-3) Deposition of Amorphous Silicon:

Deposition of amorphous silicon makes it possible to form an amorphous film in a manner as described below.

Under the conditions of a monosilane gas ($SiH_4$) of 100%, 80 cc/min, 520° C. and 100 Pa (0.75 Torr), the film grew at a rate of 0.0013 μm/min and the surface roughness RMS after the thermal oxidation treatment was 0.4 to 0.7 nm. It is possible to form a film over a relatively large area.

Accordingly, when it becomes necessary to improve the surface roughness of the silicon dioxide film on the way to form the silicon dioxide film of a predetermined thickness T (15 μm), the silicon film may be deposited by selecting either epitaxial silicon or amorphous silicon. To quicken the rate of growing the silicon film, epitaxial silicon may be selected. Epitaxial silicon deposition can be performed at a reduced pressure to a relatively small degree and an apparatus therefor is relatively simple. When amorphous silicon is deposited, there can be formed a film over a relatively large area.

Described below are functions of the above-mentioned methods of forming the silicon dioxide film.

(1) Surface Roughness and Rate of Growth of the Silicon Dioxide Film:

The deposition of epitaxial silicon or the deposition of amorphous silicon makes it possible to improve the surface roughness of the silicon dioxide film, which has been a problem in the deposition of polysilicon. Namely, the surface roughness (RMS) is greatly improved to 0.15 nm in the case of epitaxial silicon and 0.4 to 0.7 nm in the case of amorphous silicon as compared with 20.5 nm in the case of polysilicon.

Further, the rate of growing the silicon film is greatly improved to 1.06 μm/min when epitaxial silicon is deposited as compared with 0.0020 μm/min of when polysilicon is deposited. By epitaxial silicon deposition, therefore, the time for growing the film can be shortened.

(2) Productivity:

Any one of polysilicon, epitaxial silicon or amorphous silicon is appropriately selected to be deposited to form a thick silicon dioxide film on the silicon substrate depending upon such requirements as production in large amounts, production in small amounts, facility that can be utilized, requested delivery time, requested surface quality, and sizes of the surfaces to be formed.

(3) Combination of Silicon Depositions:

Further, on the way to form a thick silicon dioxide film, there may be suitably deposited polysilicon, epitaxial silicon or amorphous silicon in a suitable combination as required.

According to the method of forming a silicon dioxide film constituted by the present invention, a silicon dioxide film having a predetermined thickness can be form by repeating the steps of depositing a silicon layer on a silicon substrate, and then, subjecting the deposited silicon layer to the thermal oxidation treatment to form a silicon dioxide film, and further, the surface roughness of the silicon dioxide film that is formed and the rate of growing the silicon film that is deposited can be appropriately selected.

The invention claimed is:

1. A method of forming a silicon dioxide film on a silicon substrate, comprising:

a wet oxidation step of thermal oxidizing the surface of the silicon substrate using water vapor to form a silicon dioxide film having a thickness of 2 μm thereon, a deposition step of depositing epitaxial silicon on said silicon dioxide film formed on said silicon substrate to obtain a deposited epitaxial silicon film; and a thermal oxidation step of oxidizing said deposited epitaxial silicon film by heat in an electric furnace to convert it into a silicon dioxide film, wherein said deposition step and said thermal oxidation step are repeated a plural number of times until a resulting silicon dioxide film on the silicon substrate has a thickness for an optical waveguide, said thickness being not smaller than ten and several microns, a film growing rate of said epitaxial silicon film is 1.06 μm/min, a surface roughness of said epitaxial silicon film is 0.15 nm, and a thickness of said epitaxial silicon film formed during each repetition of said deposition step is not larger than 5 μm.

2. A method of forming a silicon dioxide film on a silicon substrate, comprising:

a wet oxidation step of thermal oxidizing the surface of the silicon substrate using water vapor at a temperature of 1080° C. to form a silicon dioxide film having a thickness of 2 μm thereon, a deposition step of depositing epitaxial silicon on said silicon dioxide film formed on said silicon substrate to obtain a deposited epitaxial silicon film having a thickness not larger than 5 μm, said depositing including introducing 20% monosilane gas to said substrate at 1200 cc/min. under conditions of 1000° C. and 5320 Pa; and a thermal oxidation step of oxidizing said deposited epitaxial silicon film by heat in an electric furnace to convert it into a silicon dioxide film, wherein said deposition step and said thermal oxidation step are repeated a plural number of times until a resulting silicon dioxide film on the silicon substrate has a thickness for an optical waveguide, said thickness being not smaller than ten and several microns, a film growing rate of said epitaxial silicon film is 1.06 μm/min, and a surface roughness of said epitaxial silicon film is 0.15 nm.

* * * * *